United States Patent [19]

Hirano

[11] Patent Number: 5,161,253
[45] Date of Patent: Nov. 3, 1992

[54] PRESET SCANNING METHOD FOR RADIO RECEIVERS

[75] Inventor: Sachiyo Hirano, Saitama, Japan

[73] Assignee: Pioneer Electronic Corporation, Tokyo, Japan

[21] Appl. No.: 658,713

[22] Filed: Feb. 21, 1991

[30] Foreign Application Priority Data

May 18, 1990 [JP] Japan ................... 2-126755

[51] Int. Cl.<sup>5</sup> ............................... H04B 1/16
[52] U.S. Cl. ................. 455/161.3; 455/166.1
[58] Field of Search ........... 455/175, 166, 161, 164, 455/165, 160; 340/825.13

[56] References Cited

U.S. PATENT DOCUMENTS

| | | | |
|---|---|---|---|
| 4,561,112 | 12/1985 | Ridder | 455/166 |
| 4,881,273 | 11/1989 | Koyama | 455/161 |
| 4,919,690 | 4/1990 | Yanagibori | 455/165 |
| 5,020,141 | 5/1991 | Meszko | 455/166 |

FOREIGN PATENT DOCUMENTS 3733028 4/1988 Fed. Rep. of Germany .
0136020 10/1981 Japan ................... 455/165

OTHER PUBLICATIONS

"Wer Socmt. Der Findet . . . Stereo-Autoradio Mit Suchlauf" in DE-7;elo, 1982 Heft 5, Seiten 18-19.
"Lernfamiges Autoradio" in Funrschau 1983, 5 pp. 51-52.

Primary Examiner—Reinhard J. Eisenzopf
Assistant Examiner—Christine Belzer
Attorney, Agent, or Firm—Sughrue, Mion, Zinn, Macpeak & Seas

[57] ABSTRACT

A preset scan method for radio receivers which is capable of performing the preset scanning without producing noise and of informing the user when it is not possible to receive all of the preset radio stations. In a preset scanning method for radio receivers in which the scanning is performed, in the order of preset channels, on all of a predetermined number of radio stations that are preset according to a preset scan mode, the preset scanning method comprising the steps of: when the preset scan mode is initiated, setting a reception field strength setting to a predetermined level; and scanning the preset radio stations in the order of the preset channels to receive radio signals only from those stations having the reception field strength higher than the predetermined level for a specified period of time each.

3 Claims, 3 Drawing Sheets

PRESET SCANNING METHOD FOR RADIO RECEIVERS

BACKGROUND OF THE INVENTION

The present invention relates to a preset scanning method for radio receivers which scans preset radio stations successively.

PRIOR ART

As a means for presetting radio stations in the radio receiver, there is available a best station memory (BSM) function or auto preset function incorporated in the radio set, which selects and presets radio stations in the order of reception field strength level.

The BSM function or auto preset function is the one to seek and scan frequency bands of the same modulation type, selects from among radio stations with the reception field strength higher than a specified level a predetermined number of radio stations, for instance six stations, in the descending order of reception field strength successively and then stores the selected station data in memory.

With the predetermined number of stations stored in memory by the BSM function or auto preset function, a preset scan key on an operation section is pressed to perform the preset scan operation. In this operation, a control circuit sets the reception frequency of the front end to the data of preset channel 1 (CH1), and demutes for a specified duration, for example eight seconds, the detection and demodulation circuit to receive signals from the radio station selected according to the data of CH1. Next, the detection and demodulation circuit is muted; the reception frequency of the front end is set to the data of preset channel 2 (CH2); and the detection and demodulation circuit is demuted again for eight seconds to receive signals from the station tuned in according to the CH2 data.

Similarly, stations are successively tuned in according to the data of preset channel 3 (CH3) through 6 (CH6). After all the preset stations have been tuned in, the tuned station returns to the one specified by the data of CH1 and the similar operation is repeated.

With the conventional preset scan method for radio receivers, however, each time the reception frequency of the front end is set according to the data of CH1 to CH6, the detection and demodulation circuit is demuted, irrespective of the level of the reception field strength of the station, to receive radio signals from that station for eight seconds. Hence, when the preset scanning is initiated at a point different from those specified by CH1 to CH6, the detection and demodulation circuit is demuted even if the receiving condition of a station specified by CH1 to CH6 is bad (i.e. the reception field strength is low). As a result, noise is produced.

SUMMARY OF THE INVENTION

This invention has been accomplished to eliminate the above-mentioned drawback and its objective is to provide a preset scan method for radio receivers which is capable of performing the preset scanning without producing noise and of informing the user when it is not possible to receive all of the preset radio stations.

A preset scanning method for radio receivers according to this invention comprises the steps of: when a preset scan mode is initiated, setting a reception field strength setting to a predetermined level; and scanning the preset radio stations in the order of the preset channels to receive radio signals only from those stations having the reception field strengths higher than the predetermined level for a specified period of time each.

In a preset scanning method for radio receivers according to another aspect of this invention, when one cycle of scanning on all the preset radio stations is completed at the first level of the reception field strength setting and if not all of the preset stations are found to have the reception field strengths higher than the first level of the reception field strength setting, the reception field strength setting is lowered to a second level, and then the scanning is performed to receive radio signals only from those stations having the reception field strengths higher than the second level for a specified period of time each.

In a preset scanning method for radio receivers according to a further aspect of this invention, a band between the first and second levels of the reception field strength setting is divided into a plurality of levels; scanning is performed on all the preset stations at the highest divided level of the band of the reception field strength setting to receive radio signals only from those stations having the reception field strength higher than that level for a specified period of time each; and when, after one cycle of scanning, not all of the preset stations are found to have the reception field strength higher than the highest divided level, the scanning proceeds to the next highest level of the reception field strength setting, with the reception field strength setting being lowered successively after each cycle of scanning until all of the preset stations can be received.

In a preset scanning method for radio receivers according to a further aspect of this invention, when not all of the predetermined number of preset stations can be received at the final or lowest level of the reception field strength setting, an annunciator is activated.

The preset scan method for radio receivers according to this invention receives signals only from those radio stations having reception field strength higher than a specified level, so that the preset scanning is performed without producing noise.

When not all of the predetermined number of preset radio stations can be received at the lowest or final level of reception field strength setting, an annunciator is activated to inform the user of this fact.

DESCRIPTION OF THE PREFERRED EMBODIMENT

Now, one embodiment of this invention will be described by referring to the accompanying drawings.

Figure 1:
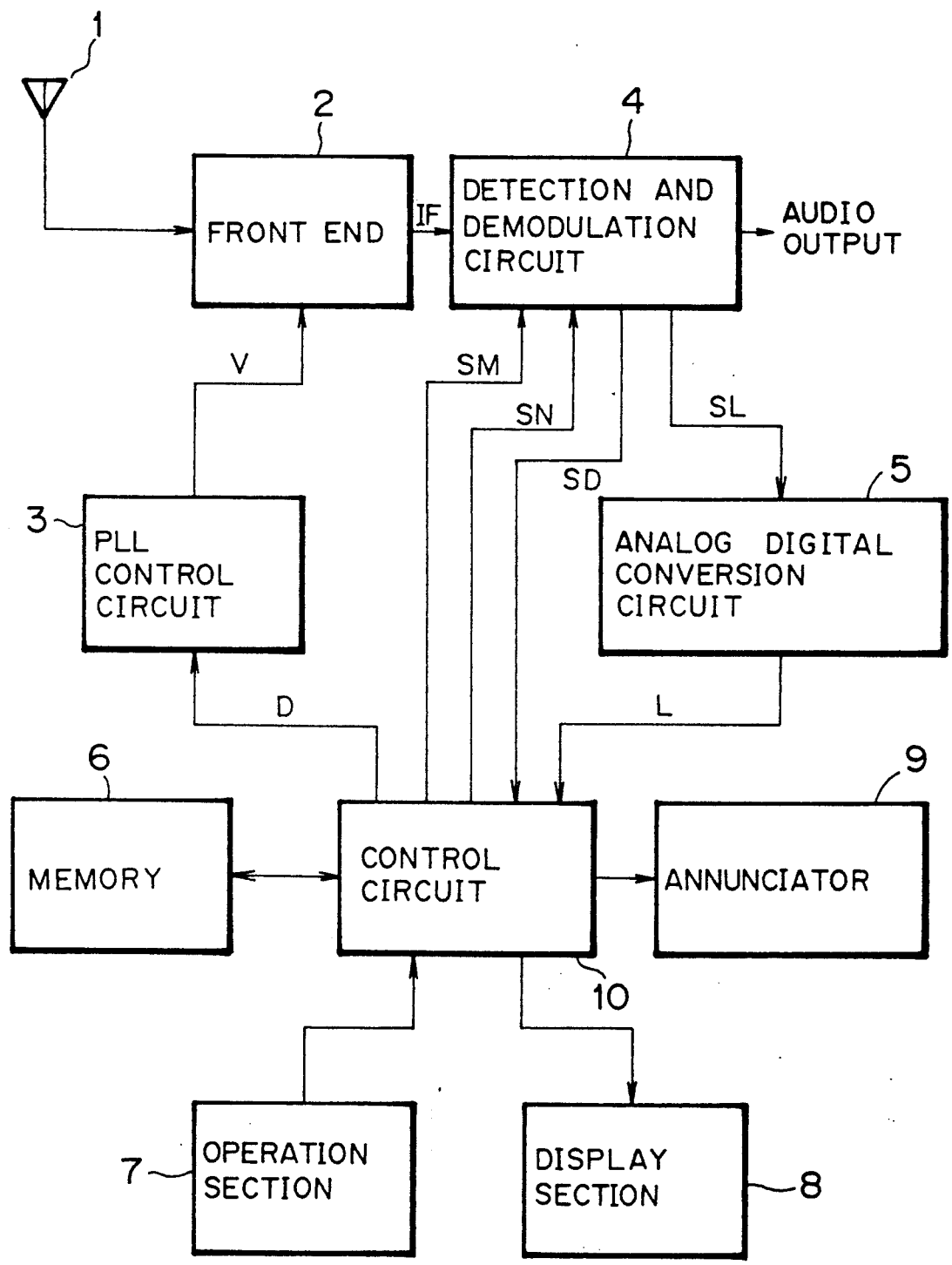
FIG. 1 is a block diagram showing the configuration of a radio receiver according to one embodiment of this invention.

FIG. 1 is a block diagram showing the configuration of a radio receiver according to one embodiment of this invention.

Reference numeral 1 represents an antenna for receiving radio waves.

Denoted 2 is a front end that determines the reception frequency f from antenna 1 according to a tuning voltage V output from a PLL (phased lock loop) control circuit 3.

Designated 3 is a PLL control circuit composed of PLL which sends the tuning voltage V to the front end 2 according to a frequency division ratio data D supplied from a control circuit 10.

Designated 4 is a detection and demodulation circuit which detects an IF signal from the front end 2, demodulates it into an audio signal and outputs the audio signal according to a demute signal SN supplied from the control circuit 10. The detection and demodulation circuit 4 also mutes the audio signal according to a mute signal SM and at the same time outputs a station detection signal SD and a reception field strength signal SL.

An analog-digital conversion circuit 5 converts the analog signal of the reception field strength signal SL output from the detection and demodulation circuit 4 into a digital signal and outputs it as a reception field strength signal L. A memory 6 stores a variety of data under the control of the control circuit 10.

It is assumed that the number of radio stations that can be preset in this memory 6 is six.

Denoted 7 is an operation section equipped with various keys and switches to initiate desired actions.

A display section 8 shows preset key numbers and the frequency of signals being received.

An annunciator 9 such as buzzer is activated by the control circuit 10.

Denoted 10 is a control circuit consisting of microcomputer which performs control on the PLL control circuit 3, detection and demodulation circuit 4, memory 6, display section 8, and annunciator 9 according to the data output from the detection and modulation circuit 4 and the analog-digital conversion circuit 5, data contained in memory 6 and output from the operation section 7.

Figure 2A:
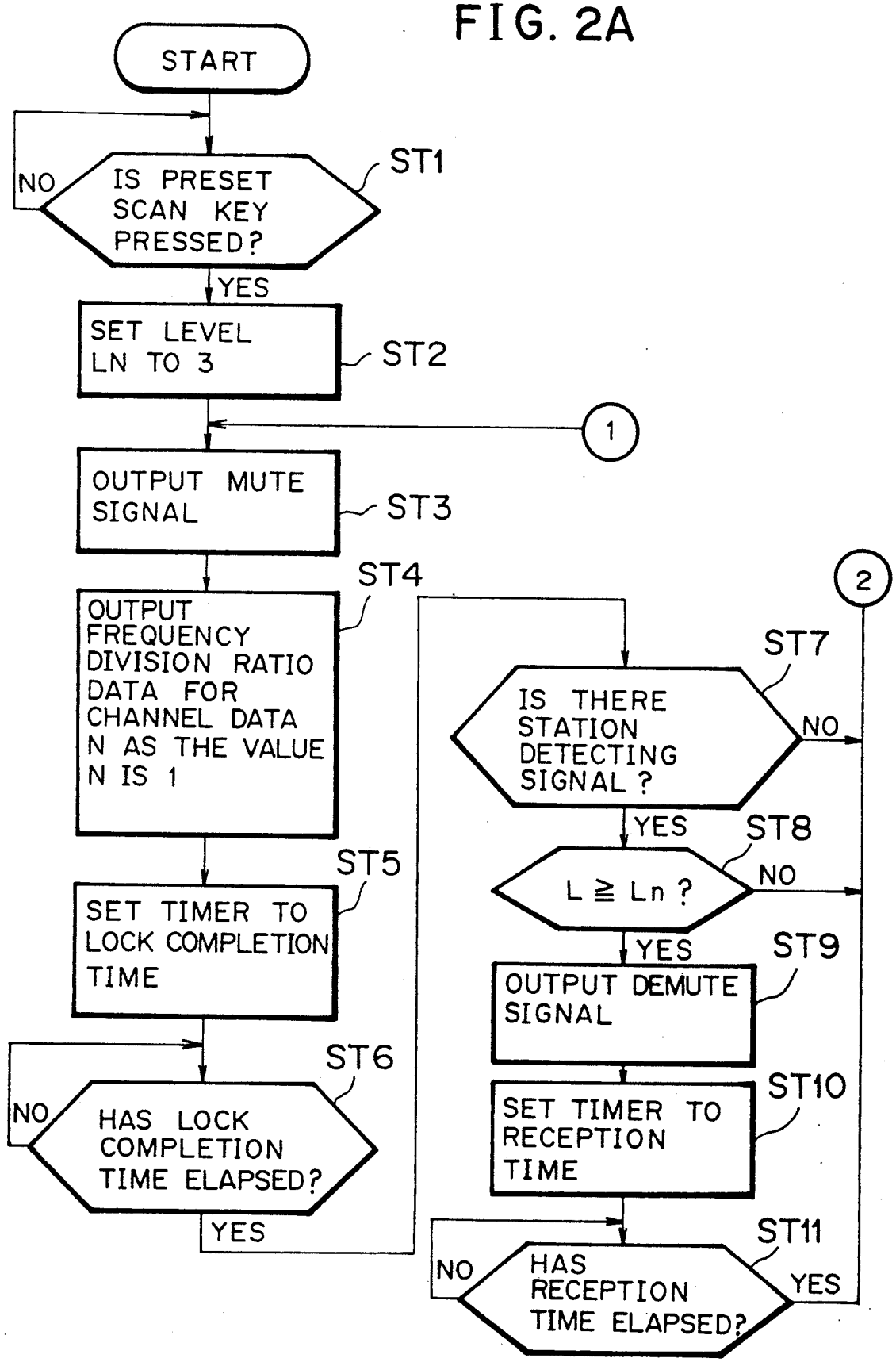
FIGS. 2A and 2B are flowcharts showing an example sequence of operation as performed by this embodiment.
Figure 2B:
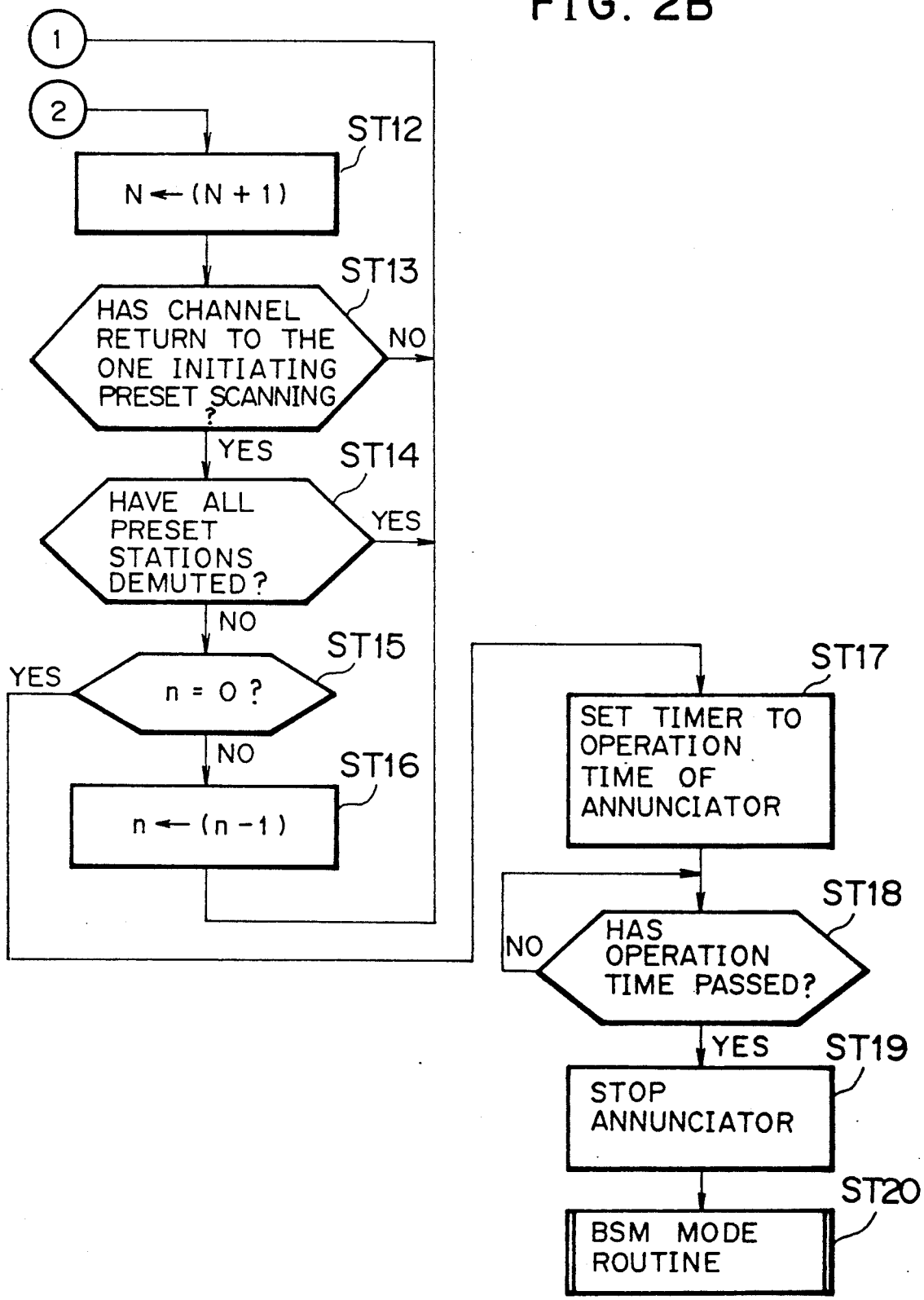

FIG. 2 comprising FIG. 2A and 2B is a flowchart showing one example sequence of operation, with ST1 to ST20 representing each step.

Next, the operation of this invention will be explained.

Let us assume that six radio stations are preset by the BSM function and stored in memory 6.

The control circuit 10 stands by waiting for the preset scan key on the operation section 7 to be pressed. When the preset scan key is pressed (step ST1), the control circuit 10 sets to 3 the value n of a comparison voltage level $L_n$ with which the reception field strength signal L is compared (step ST2) and then outputs a mute signal SM to the detection and demodulation circuit 4 (step ST3).

As a result, the detection and demodulation circuit 4 is muted, that is, it no longer outputs the audio signal.

The level $L_n$ is set in four levels—level $L_3$, level $L_2$, level $L_1$, and level $L_0$—and the reception field strength decreases in that order. These levels $L_3$ to $L_0$ are the reception field strength levels at which noise is said to be not irritating to radio listeners.

Next, the frequency division ratio data D for the channel data N in the memory 6 is given to the PLL control circuit 3 (step ST4). The value N is taken as 1 in this step.

The channel on which the preset scanning was started is stored in the memory 6.

Therefore, the PLL control circuit 3 outputs to the front end 2 the tuning voltage V according to the frequency division ratio data D to set the reception frequency f to the radio station specified by the channel data N. And the front end 2 receives radio waves from the station of the channel data N and send them to the detection and demodulation circuit 4.

Then a built-in timer is set to the lock completion time of the PLL control circuit 3 (step ST5) When the lock completion time elapses (step ST6), it is checked whether the station detection signal SD has been output from the detection and demodulation circuit 4 (step ST7). When the station detection signal SD is found to have been generated, it is then checked if the reception field strength signal L output from the analog-digital conversion circuit 5 is equal to or higher than the level $L_3$ (step ST8).

Next, when the step ST8 decides that the reception field strength signal L is equal to or higher than the level $L_3$, then the control circuit 10 outputs a demute signal SN to the detection and demodulation circuit 4 (step ST9), and sets the timer to a desired reception time, for example eight seconds (step ST10). When the reception time elapses (step ST11), or if the step ST7 has decided that no station detection signal SD has been output or the step ST8 has determined that the reception field strength signal L is lower than the level $L_3$, then the value N of the channel data N in memory 6 is incremented by one (step ST12). And then it is checked whether the channel has returned to the one for which the preset scan was first initiated (step ST13).

At step ST9 the channel that is demuted is stored in the memory 6. At step ST12 when the channel data N has reached 6, it returns to 1.

If the step ST13 decides that the channel has returned to the preset scan initiation channel, it is checked whether all of the preset stations are demuted (step ST14). When not all the preset stations are demuted, a check is made of whether or not the value n is zero (step ST15).

When the step ST15 has found the value n to be other than zero, the value n is decremented by one (step ST16). And if the step ST13 decides that the channel has not returned to the preset scan initiation channel, or if the step ST14 decides that all the preset stations have been demuted, then the processing proceeds to step ST3.

When at step ST15 the value n is found to be zero, the timer is set to the operation time of the annunciator 9, for example five seconds and the annunciator 9 is set off (step ST17). After the operation time has passed (step ST18), the annunciator 9 is stopped (step ST19) and the processing enters the BSM mode routine (step ST20).

The BSM mode routine presets, according to the BSM function, radio stations and, according to the channel data of preset channel 1, sets the reception frequency of the front end 2.

At step ST17 the data stored in the memory 6 are reset.

As mentioned above, with this embodiment, the mute is not canceled unless the reception field strength is equal to or higher than a specified level, so that noise is not generated during the preset scanning operation.

Since the setting level of the reception field strength is lowered successively after each cycle of preset scanning until all the preset stations are received, the radio programs broadcast from all the preset stations can be heard with a good reception field strength.

Furthermore, since the annunciator 9 is activated when any of the preset stations fails to be received at the lowest setting level of the reception field strength, the user can be made aware of the fact that not all of the preset stations can be received.

While in the above embodiment the reception field strength is set at a plurality of levels, it may be set at a single level.

Although the above embodiment proceeds to the BSM mode after the activation of the annunciator 9, it may move to a search mode routine or any other mode routine.

As described in the foregoing, since this invention leaves the mute in effect unless the reception field strength of the station tuned in is higher than a specified setting level, the preset scanning can be performed without generating noise.

Further, since the setting level of the reception field strength is lowered successively after each cycle of preset scanning until all the preset stations are received, the radio programs broadcast from all the preset stations can be heard with a good reception field strength.

Moreover, since the annunciator is activated when any of the preset stations fails to be received at the lowest setting level of the reception field strength, the user can be made aware of the fact that not all of the preset stations can be received, so that the user can take necessary steps.

What is claimed is:

1. In a preset scanning method for radio receivers in which the scanning is performed, in the order of preset channels, on all of a predetermined number of radio stations that are preset according to a preset scan mode, said preset scanning method comprising the steps of:

when the preset scanning method is initiated, setting a first reception field strength setting to a predetermined level;

scanning the preset radio stations in the order of the channels to receive radio signals only from those stations each having the reception field strength higher than the predetermined level for a specified period of time;

when not all of the preset stations are found to have the reception field strength higher than the first level of the reception field strength setting, second reception field strength setting at a level lower than the first reception field strength; and scanning the preset radio stations in the order of the preset channels to receive radio signals in the order of the channels to receive radio signals only from those stations each having the reception field strength higher than the second level for a specified period of time.

2. A preset scanning method for radio receivers as claimed in claim 1, wherein a band between the first and second levels of the reception field strength setting is divided into a plurality of levels; scanning is performed on all the preset stations at the highest divided level of the band of the reception field strength setting to receive radio signals only from those stations having the reception field strength higher than that level for a specified period of time each; and when, after one cycle of scanning, not all of the preset stations are found to have the reception field strength higher than the highest divided level, the scanning proceeds to the next highest level of the reception field strength setting, with the reception field strength setting being lowered successively after each cycle of scanning until all of the preset stations can be received.

3. A preset scanning method for radio receivers as claimed in claim 1 or 2, wherein when not all of the predetermined number of preset stations can be received at a final or lowest level of the reception field strength setting, an annunciator is activated.

* * * * *